United States Patent
Kadota

(10) Patent No.: US 7,343,558 B2
(45) Date of Patent: Mar. 11, 2008

(54) CONFIGURABLE AUTOMATIC-TEST-EQUIPMENT SYSTEM

(75) Inventor: Toshihide Kadota, Poway, CA (US)

(73) Assignee: Teradyne, Inc., North Reading, MA (US)

( * ) Notice: Subject to any disclaimer, the term of this patent is extended or adjusted under 35 U.S.C. 154(b) by 391 days.

(21) Appl. No.: 11/094,970

(22) Filed: Mar. 31, 2005

(65) Prior Publication Data

US 2006/0242504 A1 Oct. 26, 2006

(51) Int. Cl.
*G01R 31/28* (2006.01)
(52) U.S. Cl. .................................. 715/725
(58) Field of Classification Search ........... 714/725, 714/742; 324/754
See application file for complete search history.

(56) References Cited

U.S. PATENT DOCUMENTS

| | | | | |
|---|---|---|---|---|
| 4,760,330 A | * | 7/1988 | Lias, Jr. ............... | 714/32 |
| 5,223,788 A | * | 6/1993 | Andreano et al. ...... | 714/25 |
| 6,374,379 B1 | * | 4/2002 | Walker et al. ......... | 714/724 |
| 7,177,777 B2 | * | 2/2007 | Giral et al. ........... | 702/119 |
| 2005/0237073 A1 | * | 10/2005 | Miller et al. ......... | 324/754 |
| 2006/0171450 A1 | * | 8/2006 | Walker ................ | 375/214 |

OTHER PUBLICATIONS

Wolf, "FPGA-Based System Design", Prentice Hall PTR, vol. 3, pp. 105-110 (2004).
Taylor, "Ultra-Wideband Radar Technology", CRC Press LLC, pp. 76-83 (2001).

* cited by examiner

*Primary Examiner*—James C. Kerveros
(74) *Attorney, Agent, or Firm*—Fish & Richardson P.C.

(57) ABSTRACT

A method and system for measuring a device under test includes connecting a first test instrument and a second test instrument to a programmable logic device. The programmable logic device is configured to comply with interface specifications of the first test instrument. The second test instrument has interface specifications that are different from the interface specifications of the first test instrument. The programmable logic device is configured to comply with the interface specifications of the second test instrument.

20 Claims, 5 Drawing Sheets

CONFIGURABLE AUTOMATIC-TEST-EQUIPMENT SYSTEM

TECHNICAL FIELD

This disclosure relates to measuring characteristics of a device under test.

BACKGROUND

Automated test equipment (ATE) is computer-controlled equipment that measures the functionality and performance of a device under test (DUT). An ATE may include one or more test instruments for collecting test data from a DUT, a host computer for sending control signals to the test instruments and displaying test data to a user, and interface hardware that interfaces the test instruments with the host computer. The host computer may use device drivers for sending control signals to the test instruments through the interface hardware. If the interface specifications of some of the instruments are different from each other, the ATE may have multiple units of interface hardware customized according to the different interface specifications of the instruments. Examples of interface hardware include interleaved analog-to-digital and digital-to-analog converters. If an additional test instrument having a unique interface specification is integrated into the ATE, an additional interface hardware unit may be needed to support the unique interface specifications of the additional test instrument. Furthermore, a new device driver for controlling the additional test instrument may also be needed.

SUMMARY

In general, in an aspect, the invention is directed to a method that includes connecting a first test instrument to a programmable logic device, configuring the programmable logic device to comply with interface specifications of the first test instrument, connecting a second test instrument having interface specifications that are different from the interface specifications of the first test instrument to the programmable logic device, and configuring the programmable logic device to comply with the interface specifications of the second test instrument. This aspect may also include one or more of the following features.

Information may be transmitted between the test instruments and a host computer interfaced to the programmable logic device. The information may be relayed by the programmable logic device. Control signals that control, at least in part, the operation of the test instruments may be sent to the test instruments from device drivers within the host computer. The host computer may receive test data collected by the test instruments. A hardware configuration file that determines the structure and functionality of the programmable logic device may be loaded into the programmable logic device.

In general, in another aspect, the invention features a system that includes a test instrument configured to measure one or more characteristics of a device under test, a host computer configured to receive test data collected from the test instrument and to control the operation of the test instrument, and a programmable logic device interfacing the test instrument and the host computer. The programmable logic device may be configured to transmit information between the test instrument and the host computer. This aspect may also include one or more of the following features.

The programmable logic device may include a field programmable array (FPGA). The host computer may also include a device driver configured to control the test instrument, and a configuration selector to select the device driver from a plurality of device drivers stored within the host computer. The programmable logic device may include a port for receiving a hardware configuration file determining the structure and functionality of the programmable logic device. The hardware configuration file may include instructions that when executed by the programmable logic device cause hardware interconnects within the programmable logic device to be asserted. A network may connect the host computer and the programmable logic device.

In general, in another aspect, the invention features a system that includes a programmable logic device configured to measure one or more characteristics of a device under test, and a host computer connected to the programmable logic device through an interface. The host computer may be configured to receive test data collected from the programmable logic device and to control the operation of the programmable logic device according to a measurement plan. This aspect may also include one or more of the following features.

A test instrument may be configured to measure one or more characteristics of the device under test. The programmable logic device may interface the test instrument to the host computer. The programmable logic device may include a field programmable array (FPGA). The host computer may include a device driver configured to control a testing function performed by the programmable logic device, a configuration selector to select the device driver from a plurality of device drivers stored within the host computer, and a port for receiving a hardware configuration file determining the structure and functionality of the programmable logic device. The hardware configuration file may include instructions to cause the programmable logic device to support interface specifications of the device under test and to perform testing functions according to a measurement plan. A network may connect the host computer and the programmable logic device.

Other aspects of the invention may feature apparatus and computer program products that are used to perform the foregoing method, or that are used with the foregoing system.

Advantages that can be seen in particular implementations of the invention include one or more of the following. The programmable logic device (PLD) may be used to interface one or more test instruments to a host computer. If an additional test instrument is added, the PLD may be reprogrammed to additionally support the interface specification of the additional instrument. In some implementations, the PLD alone is sufficient to support different interface specifications of newly integrated test instruments.

The PLD may also be programmed to perform functions of one or more test instruments. When test specifications of the DUT change, for example, as a result of upgrades or changing standards, the PLD may be reprogrammed to test the DUT according to new test specifications. In some implementations, the PLD alone is sufficient to perform all desired testing functions on a DUT so that no new test instruments need to be integrated into the ATE when testing requirements change.

In some implementations, the PLD will function as both a testing instrument and an interface for other testing instruments.

The details of one or more embodiments of the invention are set forth in the accompanying drawings and the descrip-

DETAILED DESCRIPTION

Figure 1:
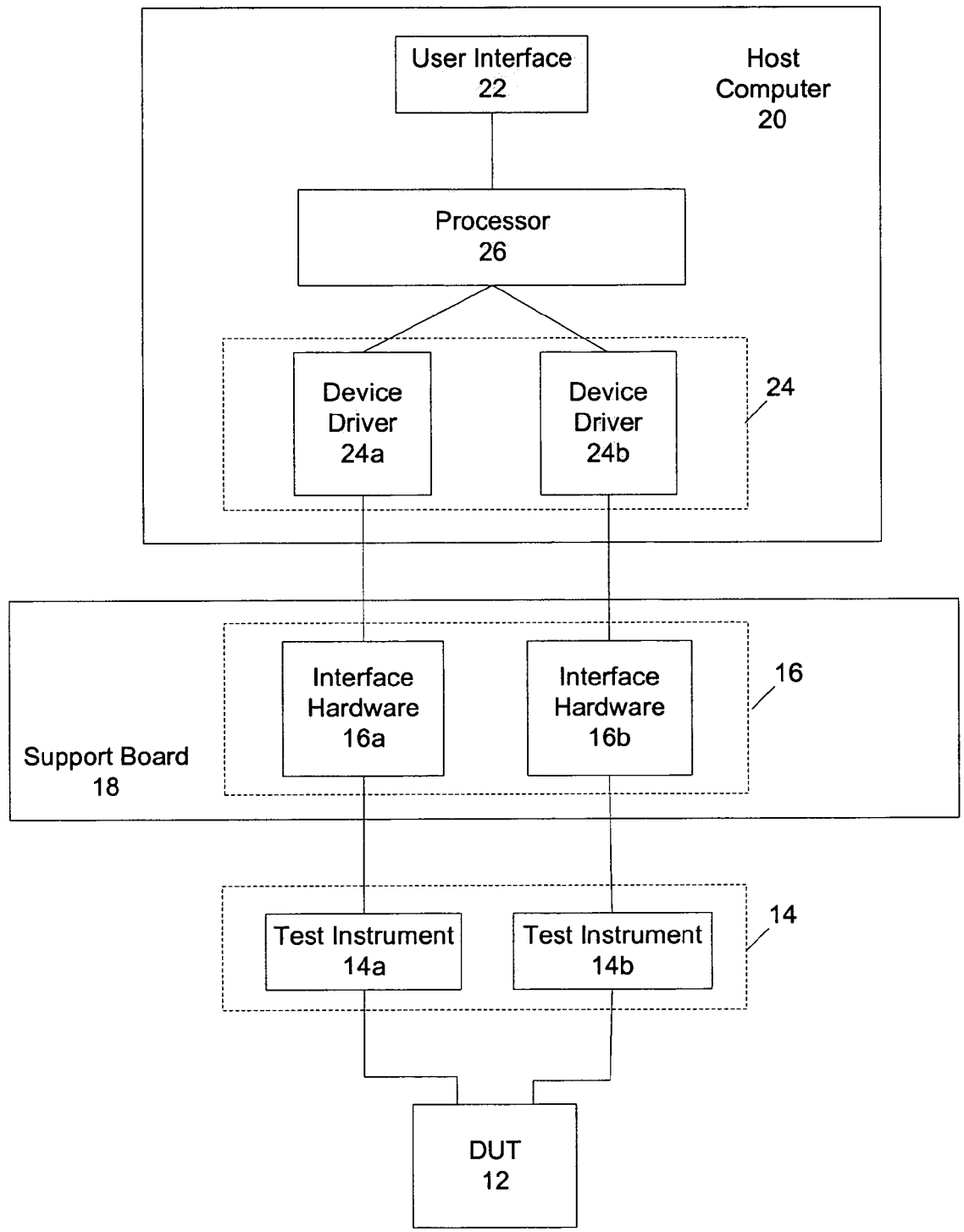
FIG. 1 shows a block diagram of an existing ATE system.

FIG. 1 shows an example of an existing automatic-test-equipment (ATE) system 10 for measuring a device under test (DUT) 12. ATE system 10 includes two different test instruments 14a and 14b (collectively referred to as test instruments 14) for collecting test data from the DUT 12; host computer 20 at which a user receives and analyzes the test data; and support board 18 containing interface hardware units 16a and 16b (collectively referred to as interface hardware 16) that control the transfer of data between test instruments 14 and host computer 20. Host computer 20 includes user interface 22, processor 26, and device drivers 24a and 24b (collectively referred to as device drivers 24) for enabling processor 26 to direct the transfer of data to and from test instruments 14 via interface hardware 16. Device driver 24a controls test instrument 14a and device driver 24b controls test instrument 14b.

DUT 12 may be any electronic device such as an application-specific integrated circuit (ASIC), a system on a chip (SOC), a microprocessor, or any other semiconductor device.

Test instruments 14 measure functionality and performance characteristics of DUT 12. Such characteristics may include voltages, currents, and frequency values of signals generated by DUT 12 in response to applied input signals. Other measured characteristics may include a speed at which DUT 12 completes a function, a bandwidth, input and output impedances, input and output capacitances, a slew rate, and any other measurable characteristics of an electronic device. Test instruments 14 may include signal generators, network analyzers, multimeters, and other electronic test equipment. Test instruments 14 have interface specifications that define the physical, functional, and operational characteristics of the interfaces between test instruments 14 and host computer 20. Interface specifications may include an allowable range of signal frequencies, a data transfer rate (e.g., bits per second), a data width (e.g., 32 bytes), input and output impedances, ranges of acceptable input and output voltages and currents, and a maximum power rating. For example, the interface specification of instrument 14a may specify a maximum input voltage of 100 mV, a minimum input current of 10 mA, and an output data rate of 10 Mb/s. The specifications of DUT 12 may change as standards evolve or new features are integrated into DUT 12. As the test requirements for DUT 12 change, either or both of test instruments 14a and 14b may not be sufficient to measure DUT 12. Consequently, additional test instruments may need to be integrated into ATE system 10.

As new instruments are added to ATE system 10, additional interface hardware for the new instruments may need to be added to support board 18. Furthermore, additional device drivers for controlling the new instruments may need to be stored in host computer 20. If an existing instrument is modified, the interface hardware and driver associated with the instrument may also need to be modified. The complexity of ATE 10 may increase quickly as the specifications of DUT 12 change and/or multiple test instruments with different interface specifications are integrated into ATE system 10.

Figure 2:
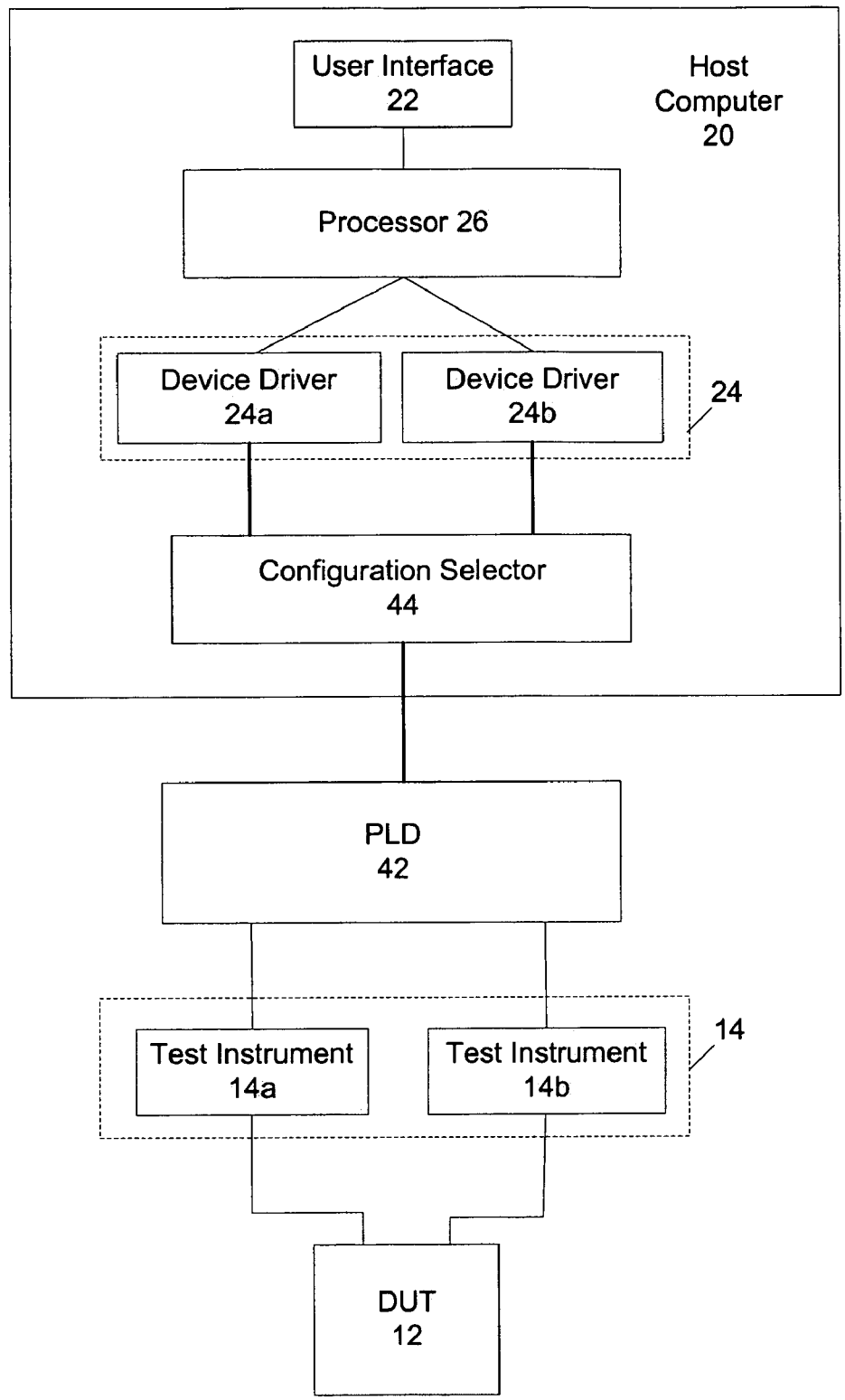
FIG. 2 shows a block diagram of an exemplary configurable ATE system.

FIG. 2 illustrates an example of a configurable ATE system 40 that includes a programmable logic device (PLD) 42, in place of the interface hardware 16 shown in FIG. 1, for interfacing test instruments 14 to host computer 20.

PLD 42 contains programmable logic that may be repeatedly configured on the fly to perform a variety of functions. Examples of PLD 42 include a field-programmable gate array (FPGA), a complex programmable logic device (CPLD), a programmable logic array (PLA), or a programmable array logic (PAL) device. PLD 42 may also include multiple programmable logic devices. The internal programmable logic of PLD 42 may include logic gates (e.g., AND gates), flip-flops, latches, and lookup tables. The internal programmable logic of PLD 42 may also be programmed to form adders, counters, multipliers, state machines and other more complex digital components. PLD 42 may also contain preconfigured counters, adders, multipliers, and the like. In one exemplary implementation, the internal logic of PLD 42 is constructed from one basic "logic-cell" duplicated hundreds or thousands of time. A logic-cell may include any combination of basic logic and more complex digital components. For example, a logic-cell may contain a lookup table, logic gates, a D-flip flop, and an adder. The logic-cells may be organized as a network of logic cells whose functions and interconnects are initially uncommitted until the PLD 42 is programmed.

PLD 42 may be programmed and reprogrammed by loading a hardware configuration file into PLD 42. The hardware configuration file specifies the interconnects that are asserted between the logic-cells and between components within the logic cells. The hardware configuration file may be a binary file compiled from a high-level hardware description language (HDL) representation of the behavior and structure of the PLD 42. Examples of HDLs include VHDL, Verilog®, and ABEL.

PLD 42 includes internal memory, such as random-access memory (RAM), for storing the hardware configuration file and other data. The memory may have multiple ports for allowing multiple devices to access the memory simultaneously. The memory may be read synchronously or asynchronously and distributed as multiple blocks throughout the PLD 42.

PLD 42 has multiple pins which may include a configuration pin for receiving a hardware configuration file, power and ground pins, clock pins for receiving external clock signals, and configurable input-output (I/O) pins. The I/O pins may be programmed to be input, output, or bi-directional ports. The I/O pins may be connected to the same voltage or to different voltages within PLD 42.

PLD 42 is configured to interface with instruments 14a and 14b. As additional instruments are added to the ATE 40, PLD 42 may be reprogrammed to interface with those instruments as well. As interface standards evolve or test requirements change, PLD 42 may be upgraded by simply loading a new hardware configuration file. In an exemplary implementation, PLD 42 alone is sufficient to interface a dynamically changing set of test instruments to host computer 20.

Host computer 20 contains one or more processor(s) (referred to simply as "processor 26") and memory (not shown) for storing device drivers 24 and other software. Processor 26 executes software, which includes applications and operating software. The operating software may include an operating system such as Windows XP®, Linux®, or MacOS®. Examples of processor 26 include general or a special purpose microprocessors, and any one or more processors of any kind of digital computer.

In host computer 20, a configuration selector 44 interfaces device drivers 24 to the PLD 42. Configuration selector 44 selects an appropriate device driver for sending control signals to a corresponding test instrument. PLD 42 may be configured at any time to interface a device driver (e.g., device driver 24a) to an instrument (e.g., instrument 14a). Configuration selector 44 may be implemented by processor 26 or by one or more other processors. Configuration selector 44 receives test data from PLD 42 and sends it to processor 26 for post-processing and analysis. Processor 26 may execute one or more software applications for processing the test data. The processed test data may be displayed at user interface 22.

At user interface 22, a user may create a measurement plan that specifies one or more tests to be performed on the DUT 12. The measurement plan may also specify the test instruments to be used for measuring DUT 12, input test signals to be applied by the test instruments, output signals to be measured from the DUT 12, and other test parameters.

A hardware configuration file may tailor PLD 42 to implement the measurement plan with greatest efficiency. The hardware configuration file, for example, may contain information sufficient to interface PLD 42 with the test instruments specified in the measurement plan. The hardware configuration file may also configure PLD 42 to execute instructions from device drivers 24. Such instructions may include sending input signals to the test instruments and measuring various output signals generated by DUT 12 in response to the input signals. The hardware configuration file may be loaded into PLD 42 from configuration selector 44.

Figure 3:
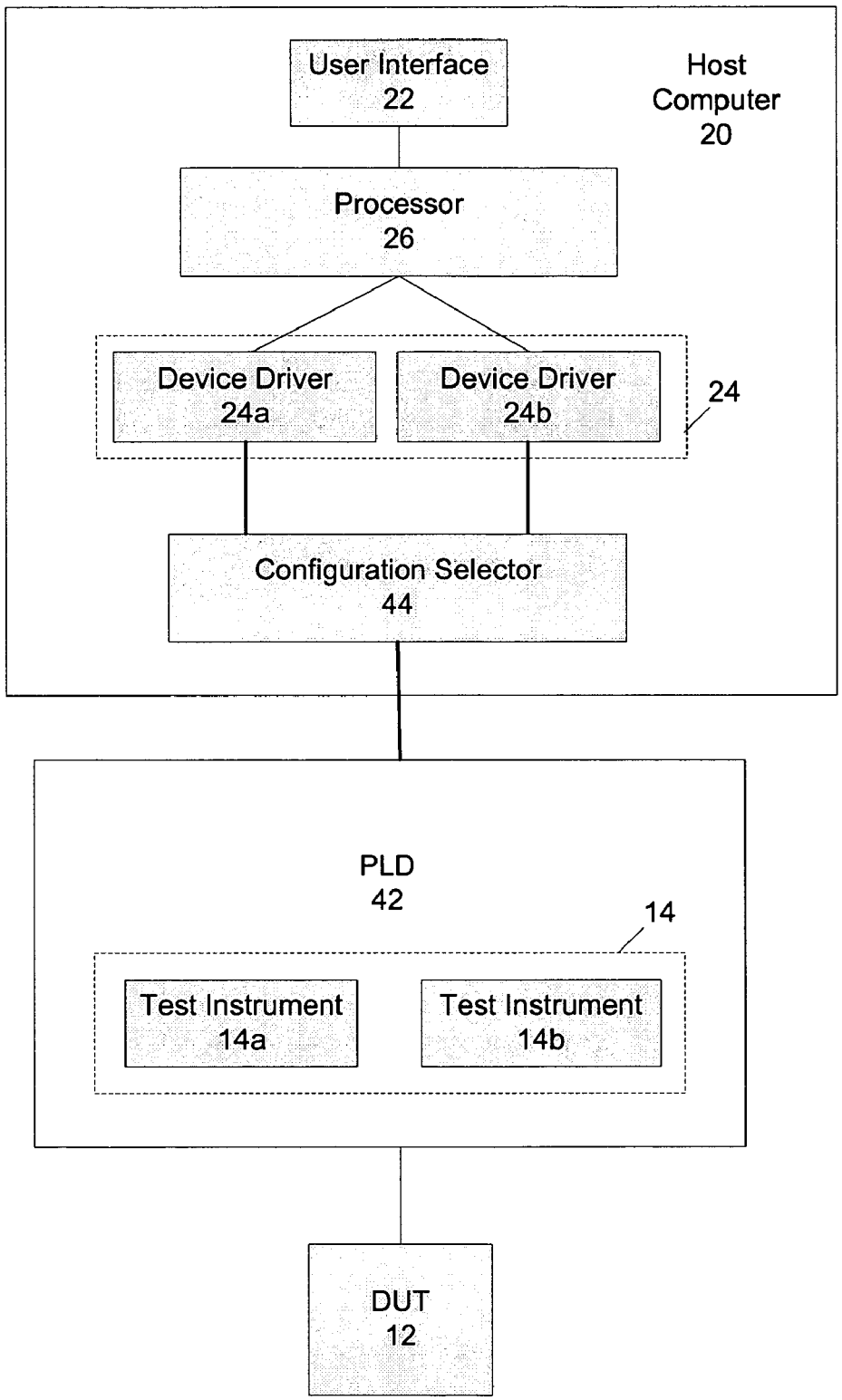
FIG. 3 shows a block diagram of an exemplary configurable ATE system.

FIG. 3 illustrates an example of a configurable ATE system 50 in which test instruments 14 of ATE system 40, shown in FIG. 2, have been replaced by PLD 42. In ATE system 50, PLD 42 may be configured to perform the functions of test instruments 14 and additional test instruments that may be integrated into ATE system 50. A hardware configuration file is used to program PLD 42 to function as a test instrument.

Such a hardware configuration file may include behavioral descriptions of test functions, structural descriptions of hardware, and interface specifications.

In one exemplary implementation, multiple tests may be performed on a single type of DUT 12 without changing the interface specifications of PLD 42. Furthermore, if interface specifications of DUT 12 change (e.g., a different kind of chip is tested), the interface of PLD 42 may be reconfigured on the fly. In an exemplary implementation, if ATE system 50 runs the same test or set of tests on various types of DUTs, only the interface of PLD 42 is reprogrammed when the interface specifications of the DUT changes. In other words, a hardware configuration file directed only to the interface of PLD 42 and not to any other internal hardware of PLD 42 is loaded into PLD 42. A hardware configuration file that programs only the interface hardware of PLD 42 may be smaller than a hardware configuration file that programs all of the hardware of PLD 42. Therefore, loading a hardware configuration file that programs only the interface of PLD may save considerable time.

ATE system 50 may also include test instruments apart from PLD 42. Such test instruments, for example, may not be easily implemented by PLD 42. In an exemplary implementation, PLD 42 implements test instruments 14 and interfaces additional test instruments to host computer 20.

Figure 4:
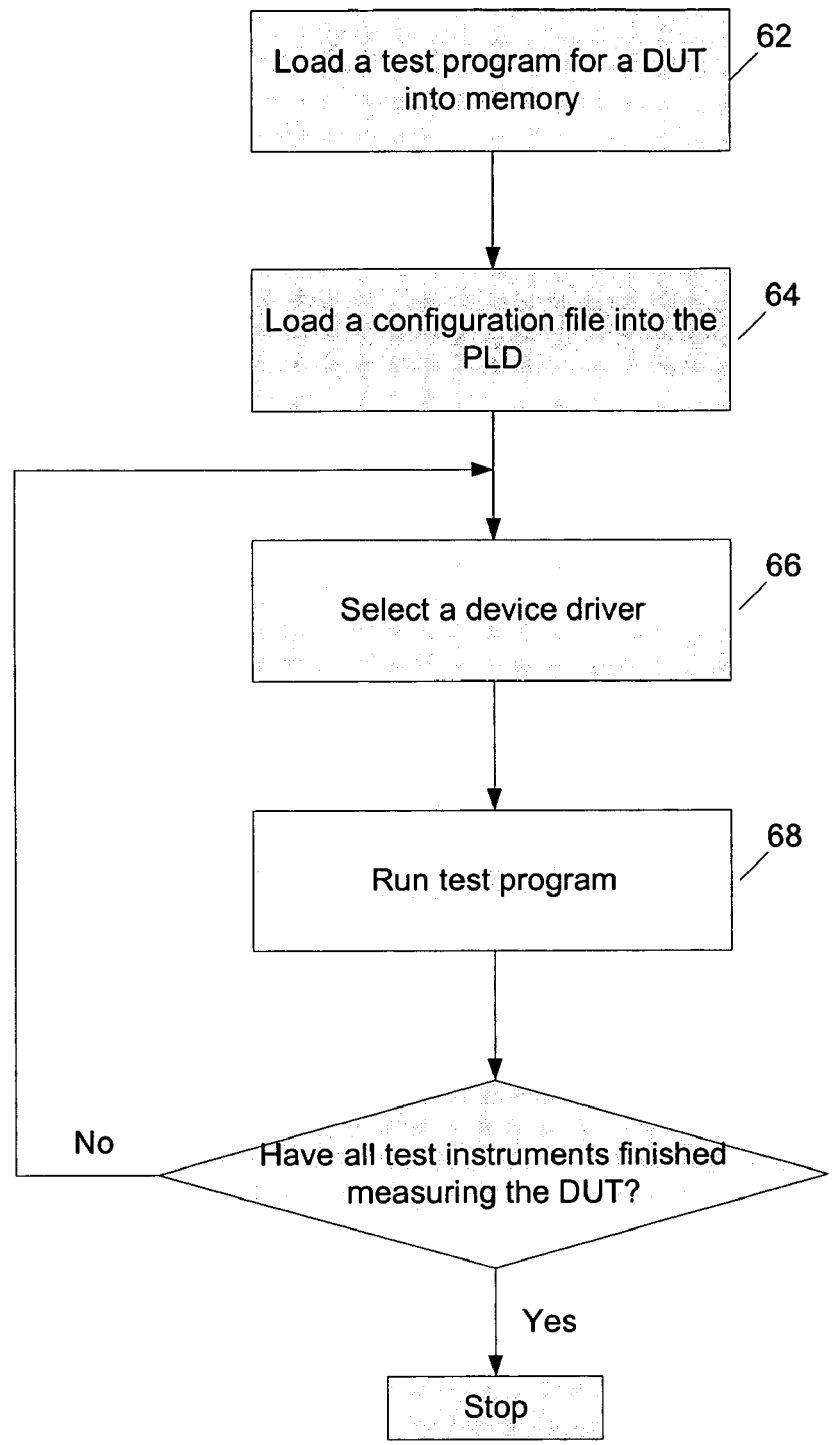
FIG. 4 is a flowchart of a process for measuring a device under test using the configurable ATE system of FIG. 2.

FIG. 4 shows a process 60 for measuring a device under test using configurable ATE system 40 of FIG. 2. A user at interface 22 loads (62) a test program into the memory of host computer 20. The test program may invoke one or more device drivers (e.g., device driver 24a) to control one or more corresponding test instruments (e.g., test instrument 14a) according to a measurement plan. A measurement plan may describe one or more tests to be performed on DUT 12, the test instruments to be used for performing the tests, input test signals to be applied by the test instruments, output signals to be measured from DUT 12, and other test parameters. A hardware configuration file is loaded (64) from host computer 20 into PLD 42. The hardware configuration file may be a binary file compiled from an HDL file and may be used to configure the internal hardware of PLD 42 to interface with a particular test instrument or set of test instruments. Configuration selector 44 selects (66) a device driver for controlling one of the test instruments. The test program is run (68) for each test instrument until all of the test instruments have finished (70) testing and collecting measurements from DUT 12.

Figure 5:
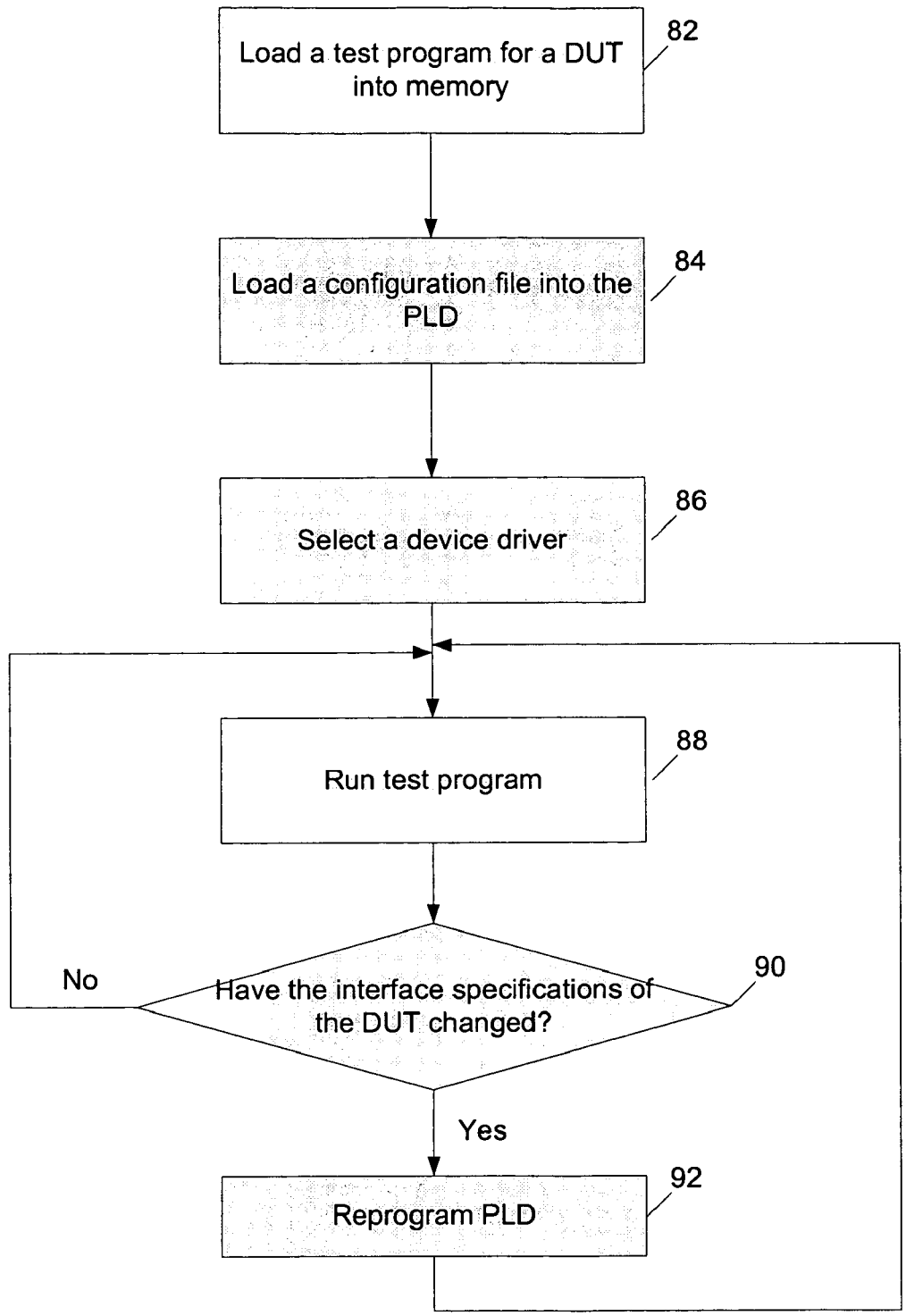
FIG. 5 is a flowchart of a process for measuring a device under test using the configurable ATE system of FIG. 3.

FIG. 5 shows a process 80 for measuring a device under test using configurable ATE system 50 of FIG. 3. A user at interface 22 loads (82) a test program into the memory of host computer 20. The test program may invoke one or more device drivers (e.g., device driver 24a) to control a test instrument or PLD 42 functioning as a test instrument (e.g., test instrument 14a) according to a measurement plan. A hardware configuration file is loaded (84) from host computer 20 into PLD 42. The hardware configuration file may be a binary file compiled from an HDL file and may be used to configure the internal hardware of PLD 42 to perform a set of test functions and interface to DUT 12. Configuration selector 44 selects (86) a driver device for controlling PLD 42 or other test instruments that may be interfaced to host computer 20 via PLD 42. The test program is run (88) for DUT 12 and may be repeatedly run for multiple DUTs having the same configuration specifications as DUT 12. If a new DUT has interface specifications that are different from a previously tested DUT (90), the interface hardware of PLD 42 is reprogrammed (92) to conform to the new interface specifications of the DUT. PLD 42 may be reconfigured with a hardware configuration file that reprograms only the interface hardware of PLD 42.

Processes 60 and 80 are not limited to use with the hardware and software described herein. Processes 60 and 80 can be implemented in digital electronic circuitry, or in computer hardware, firmware, software, or in combinations thereof.

Processes 60 and 80 can be implemented, at least in part, via a computer program product, i.e., a computer program tangibly embodied in an information carrier, e.g., in a machine-readable storage device or in a propagated signal, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Method steps associated with implementing processes 60 and 80 can be performed by one or more programmable processors executing one or more computer programs to perform the functions of the processes. All or part of processes 60 and 80 can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer include a processor for executing instructions and one or more memory devices for storing instructions and data.

The circuitry described herein, including processor 26, device drivers 24, configuration selector 44, PLD 42, and test instruments 14 may be implemented as part of ATE systems 40 and 50 or as separate circuitry for use in conjunction with ATE systems 40 and 50.

A number of embodiments of the invention have been described. Nevertheless, it will be understood that various modifications may be made without departing from the spirit and scope of the invention. For example, both ATE systems 40 and 50 could be distributed over a network. In this example, data may be transmitted between a remote host computer 20 and PLD 42 over the Internet. Accordingly, other embodiments are within the scope of the following claims.

What is claimed is:

1. A method comprising:
   connecting a first test instrument to a programmable logic device;
   configuring the programmable logic device to comply with interface specifications of the first test instrument, the interface specifications of the first test instrument defining characteristics of an interface between the first test instrument and a host computer;
   connecting a second test instrument to the programmable logic device, the second test instrument having interface specifications that are different from the interface specifications of the first test instrument, the interface specifications of the second test instrument defining characteristics of an interface between the second test instrument and the host computer; and
   configuring the programmable logic device to comply with the interface specifications of the second test instrument.

2. The method of claim 1 further comprising transmitting information between the test instruments and the host computer interfaced to the programmable logic device, the information being relayed by the programmable logic device.

3. The method of claim 2 wherein transmitting information comprises:
   sending control signals to the test instruments from device drivers within the host computer, the control signals controlling, at least in part, the operation of the test instruments; and
   receiving at the host computer test data collected by the test instruments.

4. The method of claim 1 wherein configuring the programmable logic device comprises loading a hardware configuration file into the programmable logic device, the hardware configuration file determining the structure and functionality of the programmable logic device.

5. A system comprising:
   first and second test instruments configured to measure one or more characteristics of a device under test;
   a host computer configured to receive test data collected from the first and second test instruments and to control the operation of the first and second test instruments; and
   a programmable logic device interfacing each of the first and second test instruments with the host computer using different interface specifications, the programmable logic device configured to transmit information between each of the first and second test instruments and the host computer.

6. The system of claim 5 wherein the programmable logic device comprises a field programmable array (FPGA).

7. The system of claim 5 wherein the host computer further comprises:
   a device driver configured to control the test instrument; and
   a configuration selector to select the device driver from a plurality of device drivers stored within the host computer.

8. The system of claim 5 wherein the programmable logic device comprises a port for receiving a hardware configuration file determining the structure and functionality of the programmable logic device, wherein the hardware configuration file comprises instructions that when executed by the programmable logic device cause hardware interconnects within the programmable logic device to be asserted.

9. The system of claim 8 wherein the configuration file is compiled from a VHDL script.

10. The system of claim 5 further comprising network connecting the host computer and the programmable logic device.

11. The system of claim 10 wherein the network in an Internet.

12. A system comprising:
   a programmable logic device configured to acquire several different types of measurements from a device under test, the measurements being represented as test data; and
   a host computer connected to the programmable logic device through an interface, the host computer configured to receive the test data acquired by the programmable logic device and to control the operation of the programmable logic device according to a measurement plan.

13. The system of claim 12 further comprising a test instrument configured to measure one or more characteristics of the device under test, the programmable logic device interfacing the test instrument to the host computer.

14. The system of claim 12 wherein the programmable logic device comprises a field programmable array (FPGA).

15. The system of claim 12 wherein the host computer further comprises;
   a device driver configured to control a testing function performed by the programmable logic device;
   a configuration selector to select the device driver from a plurality of device drivers stored within the host computer; and
   a port for receiving a hardware configuration file determining the structure and functionality of the programmable logic device, the hardware configuration file comprising instructions to cause the programmable logic device to support interface specifications of the device under test and to perform testing functions according to a measurement plan.

16. The system of claim 15 wherein the configuration file is compiled from a VHDL script.

17. The system of claim 12 further comprising a network connecting the host computer and the programmable logic device.

18. The system of claim 17 wherein the network in an Internet.

19. A computer program product being embodied in an information carrier, the computer program product comprising instructions that cause a computer to:
   connect a first test instrument to a programmable logic device;
   configure the programmable logic device to comply with interface specifications of the first test instrument, the interface specifications of the first test instrument defining characteristics of an interface between the first test instrument and a host computer;
   connect a second test instrument to the programmable logic device, the second test instrument having interface specifications that are different than the interface specifications of the first test instrument; and
   configure the programmable logic device to comply with the interface specifications of the second test instrument, the interface specifications of the second test instrument defining characteristics of an interface between the second test instrument and the host computer.

20. The computer program product of claim 19 comprising further instructions that cause the computer to transmit information between the test instruments and the host computer interfaced to the programmable logic device, the information being relayed by the programmable logic device.

* * * * *

UNITED STATES PATENT AND TRADEMARK OFFICE
CERTIFICATE OF CORRECTION

PATENT NO. : 7,343,558 B2  
APPLICATION NO. : 11/094970  
DATED : March 11, 2008  
INVENTOR(S) : Toshihide Kadota Page 1 of 1

It is certified that error appears in the above-identified patent and that said Letters Patent is hereby corrected as shown below:

Column 8, Claim 10, Line 37  
In Claim 10, after "comprising"  
insert -- a --.

Column 8, Claim 15, Line 60  
In Claim 15, after "comprises"  
delete ";" and insert -- : --, therefor.

Signed and Sealed this

Seventeenth Day of February, 2009

JOHN DOLL  
*Acting Director of the United States Patent and Trademark Office*